United States Patent [19]

Olcott

[11] 4,029,844
[45] * June 14, 1977

[54] ROCKET NOZZLE COMPRISING PYROLYTIC GRAPHITE-SILICON CARBIDE INSERTS

[75] Inventor: Eugene L. Olcott, Falls Church, Va.

[73] Assignee: Atlantic Research Corporation, Alexandria, Va.

[ * ] Notice: The portion of the term of this patent subsequent to Dec. 2, 1992, has been disclaimed.

[22] Filed: Feb. 20, 1975

[21] Appl. No.: 551,470

Related U.S. Application Data

[62] Division of Ser. Nos. 354,048, April 24, 1973, Pat. No. 3,900,675, and Ser. No. 65,899, Aug. 21, 1970, Pat. No. 3,738,906.

[52] U.S. Cl. .............................. 428/367; 264/29.6; 423/346; 427/122; 427/219; 427/228; 427/249; 428/408
[51] Int. Cl.² ................ C23C 11/10; C01B 31/36; B05D 7/20; B32B 9/00
[58] Field of Search ............ 428/408, 367; 264/29; 423/346; 427/177, 122, 219, 228, 249

[56] References Cited

UNITED STATES PATENTS

| | | | |
|---|---|---|---|
| 3,095,316 | 6/1963 | Hartwig | 428/408 |
| 3,459,504 | 8/1969 | Bracken et al. | 428/408 X |
| 3,547,676 | 12/1970 | Bokros et al. | 428/408 X |
| 3,622,369 | 11/1971 | Basche | 427/249 X |
| 3,755,541 | 8/1973 | Strepkoff | 423/346 |
| 3,924,034 | 12/1975 | Olcott | 427/228 |

Primary Examiner—Harold Ansher
Attorney, Agent, or Firm—Martha L. Ross

[57] ABSTRACT

A method for making said rigid pyrolytic graphite article comprising winding a continuous, individual, refractory filament or strand around a shaped form and simultaneously pyrolyzing a mixture of methyl trichlorosilane and a hydrocarbon gas onto the filament or strand at about the point of winding contact to nucleate pyrolytic graphite and SiC from the filament or strand, winding additional turns of the filament or strand around the form, each additional turn being spaced from previously wound turns and, as each of the additional turns is wound, simultaneously pyrolyzing the mixture of methyl trichlorosilane and hydrocarbon gas thereon at about the point of winding contact and on the codeposited pyrolytic graphite and SiC nucleated from previously wound turns.

12 Claims, 7 Drawing Figures

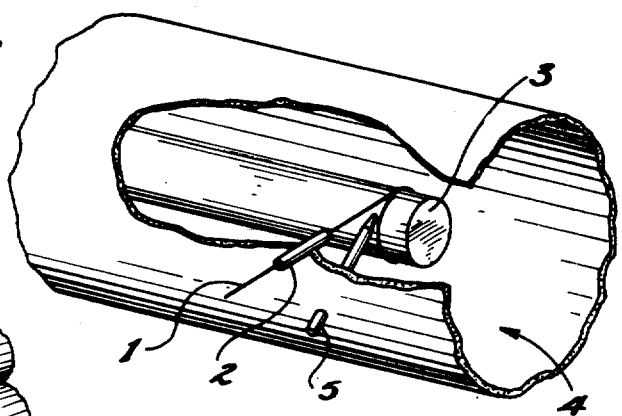
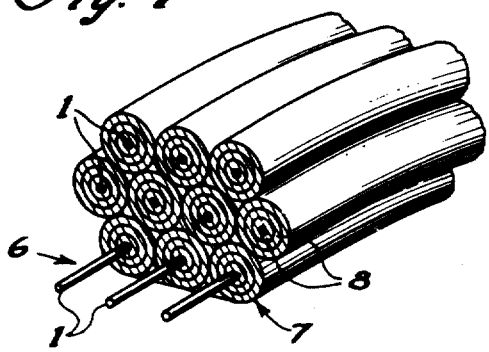
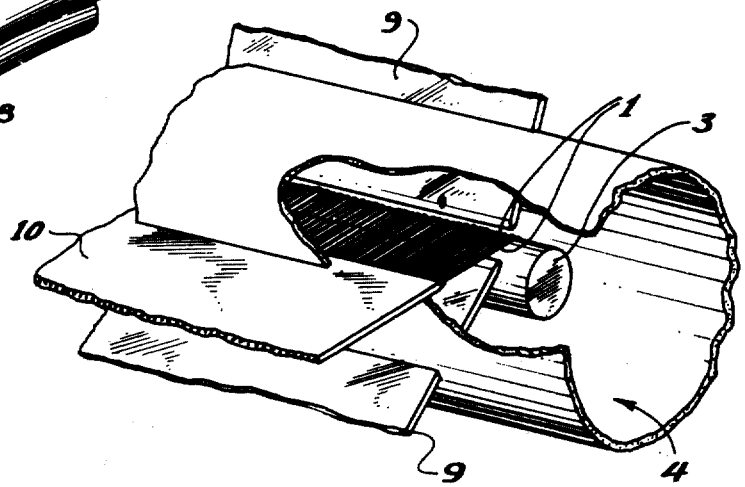
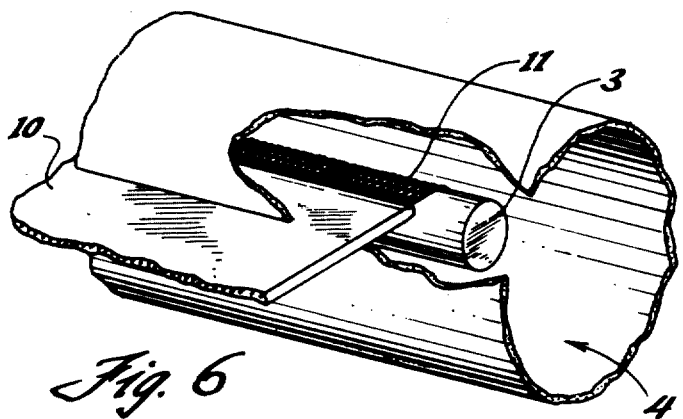
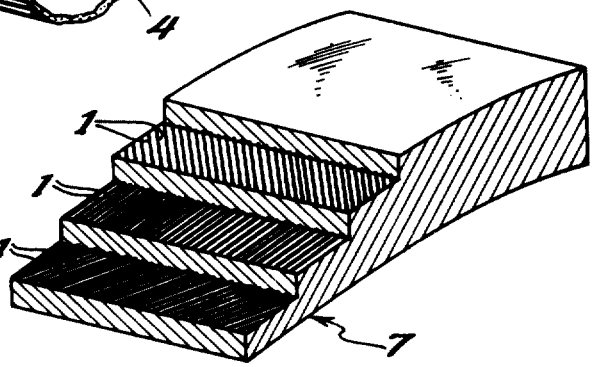

ROCKET NOZZLE COMPRISING PYROLYTIC GRAPHITE-SILICON CARBIDE INSERTS

CROSS REFERENCES TO RELATED APPLICATIONS

This is a division of application Ser. No. 354,048, filed Apr. 24, 1973, now U.S. Pat. No. 3,900,675.

This application is also a divisional of application Ser. No. 65,899 filed Aug. 21, 1970, now U.S. Pat. No. 3,738,906.

BACKGROUND OF THE INVENTION

The superior high temperature and erosion resistant properties of rigid pyrolytic graphite materials are well known. These properties make the material particularly useful as liners for chambers or vessels subject to such conditions, as rocket nozzle inserts, and the like.

Pyrolytic graphite, however, does have certain disadvantageous properties stemming from its particular crystallite structure and from its tendency to oxidize, particularly at high temperatures in an oxidizing atmosphere.

Pyrolytic graphite is normally produced by the pyrolysis of a carbonaceous gas, such as methane or propane, onto a heated substrate. Flat, hexagonal crystallities oriented parallel to the substrate surface are deposited in layers which build up into an essentially laminar structure. The pyrolytic graphite crystal is considerably wider in its flat or a–b plane than along its thickness dimension or c-axis. As a result, pyrolytic graphite is highly anisotropic in many of its properties, including strength, heat conductivity and thermal expansion, with attendant difficulties in practical use. As an example, the material has an exceedingly high coefficient of thermal expansion in the thickness of c-axis direction and a relatively low coefficient in the a–b direction. As a result, it is exceedingly difficult to match a pyrolytic graphite liner or insert with a suitable backing material which can avoid separation during thermal cycling. Because of its weakness in the c-direction, due to its flat, plate-like and, thereby, laminar microstructure, pyrolytic graphite tends to delaminate under high stresses.

The embedding within the laminar pyrolytic graphite crystallite structure of aciculae of crystalline SiC which are oriented in the c-direction, as compared to the planar orientation of the layers of the pyrolytic graphite in the a–b direction, advantageously reduces in the microcomposite the anistropic effect of the graphite matrix and reduces the tendency of the graphite to delaminate. Additionally, it substantially improves oxidation resistance since, unlike carbon which oxidizes to a gas, silicon oxidizes to $SiO_2$ which fuses to form a protective coating. Improved oxidation-resistance is particularly important if the pyrolytic graphite is exposed to high temperature oxidative atmosphere.

The production of SiC films and coating, for example, on flexible metal filaments such as tungsten, by vapor phase pyrolysis of a silane, such as $SiH_4$, $SiCl_4$, $SiHCl_3$, $(CH_3)_4Si$ or $CH_3SiCl_3$ with or without added hydrocarbon gas, is well known, the objective generally being the production of pure SiC. The pyrolysis temperatures employed are generally below the optimum temperatures for producing pyrolytic graphite.

Seishi Yajima et al, *Journal of Materials Science* 4 (1969) pp. 416–423 and 424–431, and *Chemical Abstracts*, 1970, 7, p. 69, disclose a structure comprising flake-like single crystals of SiC dispersed in a matrix of pyrolytic graphite and oriented parallel to the planes of the graphite. The crystallite size of the SiC was about 200 A thick (c-direction) and about 2000 A in diameter (a–b direction). Since the single SiC crystals of the Yajima et al structures are essentially flat and oriented in the same planar direction as the pyrolytic graphite, they cannot have any substantial effect on the anisotropy or delamination characteristics of the latter.

Yajima et al pyrolyzed a mixture of $SiCl_4$ and propane under vacuum. Maximum SiC production of up to 4 weight percent was obtained at temperatures of about 1400° to 1500° C and dropped to as little as 0.01 to 0.03 weight percent at temperatures of about 2000° C. Since SiC is considerably denser than pyrolytic graphite, the volume percent of SiC was substantially smaller.

None of the referenced art discloses the pyrolytic graphite-SiC microcomposite of this invention or the process for making it.

Copending applications Ser. No. 592,846 and 870,948 now U.S. Pat. Nos. 3,629,049 and 3,715,253 respectively, disclose rigid pyrolytic graphite articles comprising a matrix of pyrolytic graphite containing embedded therein at least one reinforcing layer consisting of a plurality of unidirectional and substantially parallel, laterally spaced, individual, continuous carbon strands. The matrix comprises crystallite layers of pyrolytic graphite nucleated from each of the individual carbon strands and interconnected to form a continuous phase surrounding and interconnecting the individual strands comprising the embedded strand layers. By conforming the crystallite pyrolytic graphite layers to embedded strand surfaces instead of to the surface of a conventional base substrate, anisotropy of the pyrolytic graphite and its attendant disadvantages are substantially reduced.

Utilization of the codeposited pyrolytic graphite-SiC microcomposite of the present invention in place of the pyrolytic graphite matrix disclosed in said copending applications provides further improvement is isotropy and improves oxidation resistance.

The object of the invention is to provide a rigid pyrolytic graphite-SiC microcomposite having substantially lower anisotropy than pyrolytic graphite and improved oxidation resistance.

Still another object is to provide a process for making said rigid pyrolytic graphite-SiC microcomposite.

Another object is to provide rigid reinforced composite pyrolytic graphite-SiC articles having additionally decreased anisotropy.

Still another object is to provide a process for making said rigid reinforced composite pyrolytic graphite-SiC articles.

Other objects and advantages will become apparent from the following description and drawings.

SUMMARY OF THE INVENTION

Broadly, the invention comprises rigid microcomposite pyrolytic graphite materials containing codeposited and embedded therein crystalline SiC comprising aciculae, the longitudinal axes of which are oriented approximately perpendicular to the a–b or flat plane of the pyrolytic graphite crystallite layers. The microcomposite is a two-phase system since the pyrolytic graphite and SiC are mutually insoluble.

The codeposition of aciculae of SiC within a matrix of pyrolytic graphite in such manner that the longitudinal axes of the aciculae are oriented approximately in the c-direction relative to the a-b plane of the pyrolytic graphite provides a substantial dimension in the thickness of c-direction which considerably reduces the anisotropy normally characteristic of pyrolytic graphite alone. This results in substantially increased strength in the thickness dimension and improvement in other properties, such as thermal expansion. Additionally, the perpendicularly embedded SiC aciculae interrupt the laminar pattern of the pyrolytic graphite and thus reduce its tendency to delaminate. Since SiC is considerably harder than pyrolytic graphite, the presence of the former in the microcomposite also improves erosion-resistance, as well as the oxidation resistance of the graphite.

The composite pyrolytic graphite-SiC material can be prepared by pyrolyzing a mixture of methyl trichlorosilane and a hydrocarbon gas onto a heated substrate at temperatures of about 2800° to 4000° F, preferably about 3200° to 3800° F, in a suitable furnace in accordance with procedures otherwise well known in the production of pyrolytic graphite.

The invention additionally comprises rigid composite articles comprising the aforedescribed pyrolytic graphite-SiC microcomposite containing embedded therein at least one reinforcing layer of a plurality of unidirectional and substantially parallel, laterally spaced, individual continuous refractory filaments or strands. The pyrolytic graphite-SiC is nucleated from each of the individual refractory filaments or strands and is interconnected to form a continuous matrix phase surrounding and interconnecting the individual filaments or strands comprising the embedded filament or strand layer.

Nucleation and growth of the pyrolytic graphite-SiC microcomposite from the embedded plurality of refractory filaments or strands further reduces and interrupts the laminar character of the pyrolytic graphite portion of the composite material and thereby further reduces anisotropy and delamination tendency. Additionally, the reinforcing refractory filaments or strands increase the strength of the composite article in the direction of filament or strand orientation.

The rigid reinforced composite pyrolytic graphite-SiC articles can be made by progressively positioning a continuous, individual refractory filament or strand onto a shaped form and simultaneously pyrolyzing a mixture of methyl trichlorosilane and a hydrocarbon gas onto the filament or strand at about the point of positioning contact to nucleate pyrolytic graphite and silicon carbide from the filament or strand, progressively positioning additional filament or strand laterally spaced from previously positioned filament or strand and, as the additional filament or strand is positioned, simultaneously pyrolyzing the mixture of methyl trichlorosilane and hydrocarbon gas thereon at about the point of positioning contact and one the codeposited pyrolytic graphite and SiC nucleated from previously positioned filament or strand. The pyrolysis temperature should be about 2800° to 4000° F, preferably about 3200° to 3800° F.

DRAWINGS

FIG. 3 is a schematic illustration of apparatus for practicing this invention.

FIG. 4 is a schematic illustration of a rigid filament or strand-reinforced pyrolytic graphite-SiC composite according to this invention.

FIGS. 5 and 6 are schematic representations of modified apparatus suitable for use in preparing the filament or strand-reinforced composites.

FIG. 7 schematically illustrates an alternative arrangement of reinforcing strands.

DETAILED DESCRIPTION

The amount of SiC should be at least about 5%, preferably at least about 10%, by volume of the microcomposite. Depending upon the desired properties for a particular application, the percent of SiC can be as high as 90 or even 95. In general, the preferred range is about 10 to 50 volume percent, with the pyrolytic graphite making up the remainder.

In some applications, it may be desirable to use a microcomposite of graded relative pyrolytic graphite and SiC composition. For example, the outermost portion of the microcomposite can have a higher SiC content to minimize oxidative surface erosion. Such graded variations in the relative amounts of the codeposited pyrolytic graphite and SiC can readily be achieved by varying respective flow rates of the methyl trichlorosilane and hydrocarbon gas and/or other processing variables in the codeposition process.

Figure 1:
FIG. 1 is a photomicrograph at a magnification of 150 of a cross-section of a sample of the pyrolytic graphite-SiC microcomposite of the invention.
Figure 2:
FIG. 2 is a photomicrograph of the same section at a magnification of 600.

The photomicrographs of FIGS. 1 and 2 at 150X and 600X magnification respectively, clearly show the SiC, a large proportion of which is in the form of needle-like aciculae of SiC oriented substantially perpendicularly to the codeposited laminar layers of pyrolytic graphite, which forms an embedding matrix. The volume percent in the photographed sample is about 20%.

The microcomposite can be made by vapor phase pyrolysis of a mixture of methyl trichlorosilane and a hydrocarbon gas onto a heated substrate at a temperature of about 2800°-4000° F, preferably about 3200°-3800° F. An inert diluent gas, such as argon, nitrogen, helium, hydrogen, and mixtures thereof is generally desirable, with some or all of the gas used to aspirate the liquid methyl trichlorosilane. Mixtures of hydrogen with argon, helium or nitrogen has been found particularly effective in obtaining good aciculae crystalline SiC formation. The process can be carried out in a conventional furnace and related equipment at reduced or atmospheric pressures. Atmospheric pressure is generally preferred because of the excellent results obtained and the convenience.

The relative flow rates of the methyl trichlorosilane and hydrocarbon gas vary generally with the desired microcomposite composition. In general, the silane may be introduced at a weight percent flow rate of about 5 to 75%, preferably about 15 to 50% and the hydrocarbon gas at a weight percent flow rate of about 25 to 95%, preferably about 50 to 85%.

The hydrocarbon gas can be any of those generally employed in producing pyrolytic graphite by vapor phase deposition, such as the lower alkanes, e.g. methane, ethane, and propane; ethylene; acetylene; and mixtures thereof. Methane is preferred.

EXAMPLE I

A cylindrical graphite substrate was seated in a 4-inch Perenny resistance furnace and heated to 3400° F. A mixture of methyl trichlorosilane, methane, argon and hydrogen were injected into one end of the graphite cylinder. The methyl trichlorosilane was entrained for injection by bubbling argon through a container of the liquid methyl trichlorosilane. Flow rates were: argon — 13 std. cu. ft/hr; hydrogen — 10 std. cu. ft/hr; methane — 2.0 std. cu. ft/hr.

Total methyl trichlorosilane consumed was 85 gm.

Pyrolytic deposition was continued for 1 hour.

The thickness of the formed microcomposite and the relative amounts of the codeposited pyrolytic graphite and silicon carbide varied with distance from the injection nozzle. The thickest portion of the microcomposite formed was 26 mils and contained about 25 volume percent of needle-like crystalline aciculae of silicon carbide embedded in laminar layers of pyrolytic graphite. The volume percent of silicon carbide decreased with increasing distance from the injector. The photomicrographs of FIGS. 1 and 2 were made with a sample taken from a downstream portion having a silicon carbide volume percent of about 20.

The rigid microcomposite cylinder formed by the above procedure was sound and showed no signs of delamination after cooling.

EXAMPLE II

A run was made under conditions substantially the same as in Example I except that the pyrolysis temperature was maintained at 3600° F.

Results were substantially similar except that at the point of maximum deposition, the relative volumes of the SiC aciculae and the pyrolytic graphite were 15 and 85% and then decreased with increasing distance from the injector.

The rigid microcomposite cylinder was sound and showed no signs of delamination after cooling.

EXAMPLE III

A pyrolytic graphite-SiC microcomposite was deposited on a one-inch diameter disc in a manner similar to the procedure used in the preceding examples except that no hydrogen was used and a one-inch disc substrate was centered at right angles to the injector so that a substantially uniform microcomposite was formed over the face of the disc.

To determine oxidation resistance, the resulting pyrolytic graphite-SiC microcomposite disc and a disc of the same size and substrate coated with an equal thickness of pyrolytic graphite were heated to about 3000° F. in a highly oxidizing oxyacetylene flame for three minutes. The pyrolytic graphite coating was fully penetrated and almost completely burned away whereas the pyrolytic graphite-SiC coating eroded only on the surface with almost half of the thickness remaining intact.

EXAMPLE IV

Several pyrolytic graphite and pyrolytic graphite-SiC microcomposite deposition runs were made on ATJ graphite discs which have a higher coefficient of thermal expansion than pyrolytic graphite in its a–b plane. By cross-sectioning of the deposits, it was determined that all of the microcomposites were free from delamination, whereas the pyrolytic graphite deposits showed major delaminations between the deposit and the substrate.

The pyrolytic graphite-SiC microcomposites can be reinforced to increase strength and further reduce anisotropy of the pyrolytic graphite component by embedding at least one layer of a plurality of unidirectional and substantially parallel, laterally spaced, individual continuous, refractory filaments or strands in the microcomposite by nucleating the codeposited pyrolytic graphite and SiC from each of the filaments or strands to form a continuous interconnecting matrix surrounding and interconnecting the individual filaments or strands.

The strands or filaments can comprise any suitable refractory material such as carbon in any suitable form including, for example, pyrolyzed rayon and pyrolytic graphite; SiC-coated metal filaments, such as tungsten; carbon alloyed with a metal, such as Th, W, Ta, Mb, or Zr, in amounts, for example, up to about 20% by weight; boron filaments, and the like.

The method can be practiced with apparatus such as that schematically illustrated in FIG. 3. As shown therein, a continuous, individual refractory filament or strand, as for example carbon strand, 1, is fed through a guide tube 2, and connected to a mandrel 3, disposed in chamber 4. To prevent oxidation of the carbonaceous gas, atmospheric oxygen is removed and continuously excluded from the chamber by evacuation and/or purging with inert gases such as helium or nitrogen. The strand is heated to and maintained at a temperature sufficient to pyrolyze the methyl trichlorosilane and hydrocarbon gases by induction, radiant, or resistance heating means, not shown. The mandrel is rotated and moved longitudinally relative to the strand guide tube 2, by means not shown. In this manner, spaced turns of strand are progressively positioned on the mandrel. As the strand is wound, the methyl trichlorosilane, hydrocarbon and carrier gas mixture are fed through tube 5, to impinge upon the strand at about the point of winding contact. Pyrolysis of the methyl trichlorosilane and hydrocarbon gas occurs and a pyrolytic graphite-SiC microcomposite matrix is nucleated from the heated strand substrate. As winding continues, the microcomposite is simultaneously deposited on the strand being wound and on the matrix deposited on previously wound strands. Thus, the strands are not only individually enveloped in a microcomposite matrix but are interconnected and bonded to each other by the matrix. The winding is continued to produce a composite article such as schematically illustrated in FIG. 4. As shown, the article comprises one or more spaced, reinforcing strand layers 6, each of which comprises a plurality of spaced strands 1, disposed in and interconnected by a pyrolytic graphite-SiC microcomposite matrix 7, comprised of graphite crystallite layers 8 containing embedded, perpendicularly oriented, codeposited aciculae of SiC.

As shown, the crystallite layers of the pyrolytic graphite in the microcomposite matrix are oriented in conformity to surfaces of the strands and are, therefore aligned around the strands and in the direction of strand orientation, thereby maximizing strength of the pyrolytic graphite component in that direction. Furthermore, the embedded strands significantly reinforce the microcomposite-strand composite in the direction of strand orientation.

Since the orientation of the pyrolytic graphite crystallite layers conforms to the strand surfaces rather than the base or mandrel substrate surface of the composite, the pyrolytic graphite component of the microcomposite does not have the continuous laminar structure characteristic of conventional pyrolytic graphite. This, together with the embedded codeposited SiC aciculae, further tends to prevent propagation of cracks and delaminations. Composite strength in the thickness direction is also further significantly improved by the increased degree of crystallite layer alignment in that direction. In addition, the marked disparity in thermal expansion in the a–b and c directions characteristic of conventional pyrolytic graphite is further reduced.

The strands also prevent delamination failures by restricting the thickness of laminar pyrolytic graphite component growth units nucleated from these strands. It is known that growth units less than 0.05 inches thick are less subject to delamination. Since, in the composition of this invention, the thickness of laminar pyrolytic graphite component units is generally about one-half the distance between the strands; preferred unit size is obtained by spacing the strands less than 0.1 inch of each other.

The process for composite fabrication can be practiced with individual strands, as in the embodiment described, or with multi-strand structures, such as a plurality of laterally spaced, unidirectionally oriented individual strands, or with woven cloths or tapes comprising strands oriented in both warp and woof directions. When using multi-strand structures to prepare a composite, it is preferred simultaneously to impinge the reactive gas mixture on both sides of the strand structure as it is progressively laid down to ensure that the gas penetrates between the strands to effect the highest degree of lateral bonding. This can be accomplished by apparatus such as schematically illustrated in FIG. 5, wherein gas injector channels 9, feed gas into contact with spaced strands 1, or by apparatus as shown in FIG. 6, wherein woven refractory cloth 11 and gas are both fed through guide channel 10.

When the method is practiced with woven fabrics, little matrix bond is obtained between strands where warp and woof intercross since it is difficult for the reaction gas mixture to penetrate between the touching strands. It is, therefore, preferred that all strands in each reinforcing strand layer in the composite be substantially unidirectionally oriented. Such orientation eliminates weaknesses which result from the absence of a matrix bond at points of strand to strand contact. In composites having multiple reinforcing strand layers, the direction of strand orientation can be varied in different reinforcing layers as shown, for example, in FIG. 7. Thus composites having desired directional strength characteristics can readily be prepared.

This invention can, of course, be practiced by positioning strand on a variety of shaped forms to produce articles having the desired configuration. The strand can be progressively positioned on the shaped form by any desired technique. However, winding is preferred for reasons of simplicity. It will be understood from the foregoing discussion that the term "progressively" positioning connotes a gradual laying down of strand to continuously and progressively increase the area of strand contact with the shaped form rather than effecting overall lateral strand contact as by "stacking". This permits matrix formation between strands as they are positioned and eliminates the necessity of forcing the feed gas mixture between prepositioned strands.

When the invention is practiced with strands, such as carbon yarns, which comprise a multiplicity of fibers which have been spun or otherwise incorporated to form the continuous strand, the pyrolytic graphite-SiC microcomposite may, in some instances be deposited on fibers or fuzz protruding from the strand rather than directly on the base strand. Therefore, in order to obtain optimum lateral bonding of strands by the matrix, it may be desirable to minimize such protrusions as, for example, by mechanically removing them with a scraper blade as the matrix is built up or by utilizing strands precoated with pyrolytic graphite to provide a smooth surface.

Although this invention has been described with reference to illustrative embodiments thereof, it will be apparent to those skilled in the art that the principles of this invention can be embodied in other forms but within the scope of the claims.

I claim:
1. A process for making a rocket nozzle insert of pyrolytic graphite microcomposite comprising pyrolytic graphite containing embedded therein codeposited silicon carbide comprising aciculae of silicon carbide, the longitudinal axis of said aciculae being aligned in the c-direction relative to the a–b plane of the associated pyrolytic graphite crystallite at the point of embedment, which comprises pyrolyzing a mixture of methyl trichlorosilane, an inert diluent gas, and a hydrocarbon gas onto a heated cylindrical substrate at a temperature of about 2800° – 3800° F and at a pressure at which said silicon carbide aciculae are formed, the volumetric ratio of inert gas to hydrocarbon gas being at least 86.7 to 13.3 and the weight ratio of methyl trichlorosilane to hydrocarbon being between about 5–95 and 75–25; and shaping the resulting microcomposite cylinder into a rocket nozzle insert.

2. The process of claim 1 in which the temperature is about 3200° F–3800° F.

3. The process of claim 2 in which the hydrocarbon gas is methane.

4. The process of claim 3 in which the inert diluent gas is argon, a mixture of hydrogen and argon, helium, or nitrogen.

5. The process of claim 1 in which the hydrocarbon gas is methane.

6. The process of claim 1 in which the pyrolysis is carried out at atmospheric pressure.

7. The process of claim 1 which includes the steps of:
1. progressively positioning continuous refractory filaments or strands on a cylindrical form;
2. pyrolyzing said mixture of methyl trichlorosilane, inert diluent gas, and hydrocarbon gas onto said filament or strand at said temperature and pressure at about the point of positioning contact as said filament or strand is positioned and thereby nucleating said micorcomposite from said filament or strand;
3. progressively positioning additional continuous filament or strand; and
4. as said additional filament or strand is positioned, simultaneously pyrolyzing said mixture at said temperature and pressure on said additional filament or strand at about the point of positioning contact and on said microcomposite nucleated from previously positioned filament or strand to form a microcomposite matrix interconnecting laterally spaced filaments or strands.

8. The method of claim 7 wherein said continuous filament or strand is an individual filament or strand.

9. The method of claim 7 wherein said continuous filament or strand is a filament or strand layer comprising a plurality of laterally spaced, substantially unidirectionally oriented individual filaments or strands.

10. The process of claim 7 in which the hydrocarbon gas is methane.

11. The method of claim 7 wherein said refractory strand is carbon.

12. The process of claim 11 in which the hydrocarbon gas is methane.

* * * * *